United States Patent
Oike et al.

(10) Patent No.: US 10,772,250 B2
(45) Date of Patent: Sep. 8, 2020

(54) COMPONENT MOUNTING DEVICE AND COMPONENT MOUNTING SYSTEM

(71) Applicant: FUJI CORPORATION, Chiryu (JP)

(72) Inventors: Hiroshi Oike, Chiryu (JP); Hirotake Esaki, Ichinomiya (JP); Kenji Sugiyama, Anjo (JP)

(73) Assignee: FUJI CORPORATION, Chiryu (JP)

( * ) Notice: Subject to any disclaimer, the term of this patent is extended or adjusted under 35 U.S.C. 154(b) by 96 days.

(21) Appl. No.: 16/310,145

(22) PCT Filed: Jun. 17, 2016

(86) PCT No.: PCT/JP2016/068083
§ 371 (c)(1),
(2) Date: Dec. 14, 2018

(87) PCT Pub. No.: WO2017/216950
PCT Pub. Date: Dec. 21, 2017

(65) Prior Publication Data
US 2019/0335632 A1    Oct. 31, 2019

(51) Int. Cl.
*H05K 13/00* (2006.01)
*H05K 13/08* (2006.01)
*H05K 13/04* (2006.01)
*G05B 19/418* (2006.01)

(52) U.S. Cl.
CPC ... *H05K 13/0812* (2018.08); *G05B 19/41805* (2013.01); *H05K 13/0409* (2018.08); *G05B 2219/45031* (2013.01)

(58) Field of Classification Search
CPC .................................................. H05K 13/0812
See application file for complete search history.

(56) References Cited

FOREIGN PATENT DOCUMENTS

| JP | 2007-147354 A | 6/2007 |
| JP | WO 2015/001634 A1 | 2/2017 |
| JP | WO 2015/040696 A1 | 3/2017 |
| JP | WO 2016/092673 A1 | 9/2017 |

OTHER PUBLICATIONS

International Search Report dated Sep. 13, 2016 in PCT/JP2016/068083 filed on Jun. 17, 2016.

*Primary Examiner* — Tejal Gami
(74) *Attorney, Agent, or Firm* — Oblon, McClelland, Maier & Neustadt, L.L.P.

(57) ABSTRACT

Component mounting system 1 includes electronic component mounting device 10, control device 100, image processing device 110, memory device 115, and display 120. Electronic component mounting device 10 includes mounting head 26, supply device 28, and component camera 90, and is configured to use mounting head 26 to pick up an electronic component supplied by supply device 28 and to image the held electronic component using component camera 90. When saving the captured image data on memory device 115, it is determined whether a condition for using a first format is satisfied (S1, S2). When the conditions for using the first format are satisfied (S2: yes), the captured image data is saved on memory device 115 in the first format that is a lossless compression format (S5). When conditions for using the first format are not satisfied (S2: no), the captured image data is saved on memory device 115 in the second format, which is a lossy compression format.

5 Claims, 4 Drawing Sheets

COMPONENT MOUNTING DEVICE AND COMPONENT MOUNTING SYSTEM

TECHNICAL FIELD

The present application relates to a component mounting device configured to mount components picked up by a pickup nozzle on a board, and to a component mounting system including the component mounting device.

BACKGROUND ART

Conventionally, it is typical to configure a board production line by using a conveyance device to connect various pieces of equipment used to produce a board mounted with many components, the equipment including a screen printer, a component mounting device, a reflow device, and so on. With component mounting devices and the like used to configure a board production line, a component is picked up by a pickup nozzle and mounted at a specified position on the board.

With a component mounting system including a component mounting device, to mount components with high accuracy at specified positions on the board, image processing is performed on image data captured of the component picked up by the pickup nozzle and a determination made about the position of the component and whether the component is good. Because such image data is used as valuable material to adjust mounting work and work processes including the mounting work, the data is saved on a memory device or the like.

Devices such as that disclosed in patent literature 1 related to such technology are known. An inspection machine disclosed in patent literature 1 includes an inspection machine main body for inspecting a board on which electronic components are mounted, and is configured to acquire, from among the inspection result data obtained by inspection by the inspection machine main body, defective board data of a board determined to include a defective portion. The inspection machine extracts, from the defective board data, image data of the entire board captured by the camera and image data of a defective portion captured by the camera, performs high-level compression on the image data of the entire board and saves that data on a memory device, and performs low-level compression (including no compression) on the image data of the defective portion and saves that data on the memory device.

CITATION LIST

Patent Literature

Patent literature 1: JP-A-2007-147354

BRIEF SUMMARY

Technical Problem

With such a component mounting device and a component mounting system including such a component mounting device, image data captured by the camera and saved on the memory device can be used as an aid for cause analysis when adjusting mounting work or image processing at the component mounting device, and further, can be used to understand circumstances during mounting work in a case in which an error occurs at a stage after the component has been mounted on the board.

Considering this use, it is desirable to save as many pieces of image data as possible and with as much information as possible (for example, with high quality and high resolution). However, considering the storage capacity of the memory device and transmission loads for the image data, a configuration that can save many pieces of image data with a large amount of information is not appropriate for practical use of the component mounting device and component mounting system.

With respect to this point, an inspection machine disclosed in patent literature 1 performs low-level compression (including non-compression) on image data of a defective portion based on whether the image target is the entire board or the defective portion, and saves that data on a memory device. Therefore, an inspection machine of patent literature 1 greatly increases the load with respect to the memory capacity of the memory device and the transmission load of the image data.

However, in a case in which it is necessary to adjust image processing or mounting work, in many cases the cause is the component mounting device itself or the effect of the surrounding environment, and further, when performing adjustment of the mounting work or the image processing at the component mounting device, the information quantity of the image data that is required changes depending on the usage, such as adjustment or cause analysis.

For example, in a case of adjusting the mounting work or image processing at the component mounting device, because it is desirable to accurately recreate the contents of the image processing and the state of the component and so on, it is required to have image data with a relatively large amount of information. On the other hand, in a case in which an error occurs at a process after the component has been mounted on the board, it is sufficient to simply check whether an error occurred at the component mounting device, so the image data only needs an amount of information sufficient for a visual check of the image data. That is, to reduce the load with respect to the memory capacity of the memory device, it is desirable to save image data on the memory device in a state according to the usage at the component mounting device, such as adjustment of mounting work or image processing.

The present disclosure takes account of the above problems and an object thereof is to provide, with respect to a component mounting device or the like that mounts a component picked up by a pickup nozzle on a board, a component mounting device or the like configured to save image data captured of the component being held by the pickup nozzle in an appropriate format while reducing the load with regard to memory capacity of a memory device.

Solution to Problem

To solve the above problem, a component mounting device of the present disclosure includes: a component supply section configured to supply components to be mounted at a specified position of a board; a pickup nozzle configured to pick up a component supplied by the component supply section; an imaging section configured to acquire image data by imaging a component picked up by the pickup nozzle; a memory section configured to save the image data imaged by the imaging section; a condition determining section configured to determine whether a state of an image imaged by the imaging section satisfies specified conditions for high importance; and a saving control section configured to, in a case in which it is determined by the condition determining section that the conditions for high importance are satisfied, save the image data imaged by the imaging section on the memory section in a first format that is a lossless compression format, and in a case in which it is determined by the condition determining section that the conditions for high importance are not satisfied, save the image data imaged by the imaging section on the memory section in a second format that is a lossy compression format.

Advantageous Effects

According to the present disclosure, because a component supply section, a pickup nozzle, an imaging section, and a memory section are provided, it is possible to image a component picked up by the pickup nozzle and save the captured image data on the memory section. Further, because a condition determining section and a saving control section are provided, in a case in which it is determined by the condition determining section that conditions for high importance are satisfied, it is possible to save the image data captured by the imaging section on the memory section in a first format that is a lossless compression format on the memory section. In cases in which the conditions for high importance are satisfied, because in many cases a large amount of information is required when using the image data, by saving in a first format that is a lossless compression format, it is possible to maintain a sufficient amount of information. On the other hand, for cases in which it is determined by the condition determining section that conditions for high importance are not satisfied, image data captured by the imaging section can be saved on the memory section in a second format that is a lossy compression format. In cases in which the conditions for high importance are not satisfied, because there are many cases in which a large amount of information is not required when using the data, by saving in a second format that is a lossy compression format, this is efficient from both the point of view of the information amount and from the point of view of the memory capacity of the memory section. In other words, because a setting is specified to save the image data in either a first format that is a lossless compression format or a second format that is a lossy compression format and image data captured by the imaging section is saved on the memory section in accordance with whether a captured image satisfies conditions for high importance, it is possible to save the captured image data on the memory section in an appropriate form while reducing the load with respect to the memory capacity of the memory section.

DESCRIPTION OF EMBODIMENTS

Figure 1:
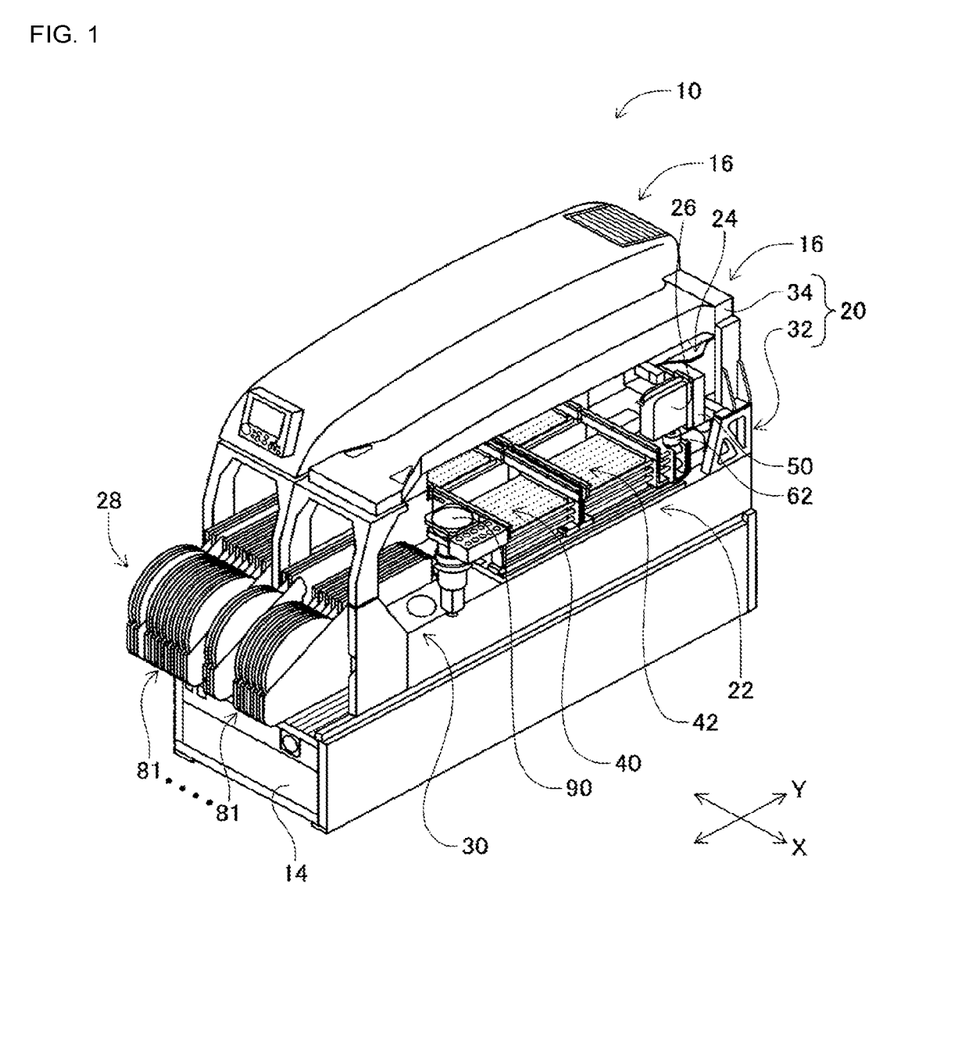
FIG. 1 is a perspective view of the outside of a component mounting device according to an embodiment of the disclosure.

Embodiments of a component mounting device and a component mounting system of the present disclosure, that is, electronic component mounting device 10 and component mounting system 1 including electronic component mounting device 10, are described below with reference to the figures. FIG. 1 is a perspective view of electronic component mounting device 10 according to an embodiment of the disclosure.

Configuration of Electronic Component Mounting Device

Electronic component mounting device 10 of an embodiment of the disclosure is a device for mounting electronic component on a circuit board. Electronic component mounting device 10 includes one system base 14, and two mounting machines 16 that are installed side by side on system base 14. In the following description, the X-axis direction refers to the direction in which mounting machines 16 are lined up, and the Y-axis direction refers to the horizontal direction orthogonal to the X-axis direction.

Each mounting machine 16 is provided mainly with mounter main body 20, conveyance device 22, mounting head moving device (hereinafter in some cases abbreviated to "moving device") 24, mounting head 26, supply device 28, and component camera 90. Mounter main body 20 is configured from frame 32 and beam 34 that is mounted on frame 32.

Conveyance device 22 is provided with two conveyor devices (conveyor device 40 and conveyor device 42). Conveyor device 40 and conveyor device 42 are parallel to each other and are provided on frame 32 extending in the X-axis direction. Conveyor device 40 and conveyor device 42 conveyor a circuit board supported by both in the X-axis direction using electromagnetic motor 46 (refer to FIG. 2). Also, the circuit board is fixedly held at a specified position by board holding device 48 (refer to FIG. 2).

Moving device 24 is an XY robot provided with electromagnetic motor 52 (refer to FIG. 2) for sliding slider 50 in the X-axis direction, and electromagnetic motor 54 (refer to FIG. 2) for sliding slider 50 in the Y-axis direction. Mounting head 26 is attached to slider 50, and mounting head 26 is moved to any position on frame section 32 by operation of the two electromagnetic motors 52 and 54.

Mounting head 26 mounts electronic components on a circuit board. Mounting head 26 includes suction nozzle 62 provided on a lower end surface of mounting head 26. Suction nozzle 62 is connected to positive and negative pressure supply device 66 (refer to FIG. 2) via a negative pressure air passage and a positive pressure air passage. Suction nozzle 62 picks up and holds an electronic component using negative pressure, and releases the held electronic component using positive pressure. Also, mounting head 26 has nozzle raising and lowering device 65 (refer to FIG. 2) that raises and lowers suction nozzle 62. Mounting head 26 uses nozzle raising and lowering device 65 to change the vertical position of a held electronic component.

Supply device 28 is a feeder type supply device and is provided on the front end of frame 32 in the Y-axis direction. Supply device 28 has tape feeders 81. Tape feeders 81 house taped components, which are electronic components housed in tape, in a wound state. Tape feeder 81 feeds the taped components using feeding device 82 (refer to FIG. 2). Accordingly, feeder type supply device 28 supplies an electronic component to a supply position through the feeding delivery of the taped components. Note that, tape feeder 81 can be detached from frame section 32 to support the exchange of electronic components and so on, and splicing of taped components can be performed to add additional electronic components.

Figure 2:
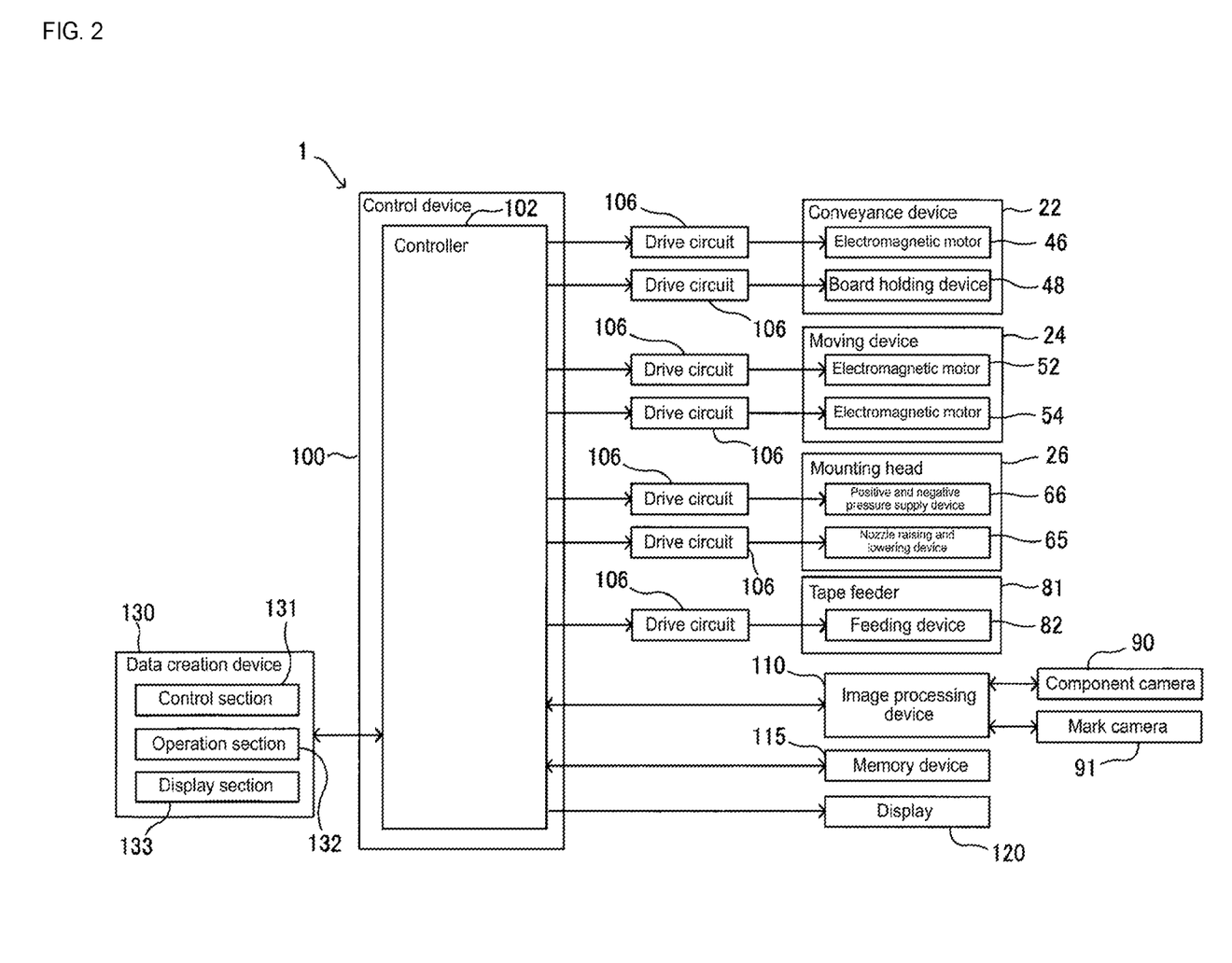
FIG. 2 is a block diagram representing control items of a component mounting system according to an embodiment of the disclosure.

Mounting machine 16 is also provided with component camera 90 and mark camera 91 (refer to FIG. 2). As shown in FIG. 1, component camera 90 is provided in a state facing upwards on frame section 32 between board conveyance device 22 and component supply device 28. Thus, component camera 90 is able to capture an image of a component picked up and held by suction nozzle 62 of mounting head 26. Also, mark camera 91 is attached to slider 50 in a state facing down, and moves in the X, Y, and Z directions together with mounting head 26. Thus, mark camera 91 can capture an image of any position on frame section 32.

As shown in FIG. 2, mounting machine 16 is provided with control device 100. Control device 100 includes controller 102, which is configured mainly from a computer and includes a CPU, ROM, RAM, and so on. Controller 102 is connected to multiple drive circuits 106 and the multiple drive circuits 106 are connected to electromagnetic motor 46, electromagnetic motor 52, electromagnetic motor 54, board holding device 48, nozzle raising and lowering device 65, positive and negative pressure supply device 66, and feeding device 82. By this, operation of conveyance device 22, moving device 24, and so on is controlled by controller 102.

Controller 102 is also connected to image processing device 110, memory device 115, display 120, and data creation device 130. Image processing device 110 is for processing image data obtained by component camera 90 and mark camera 91, and controller 102 acquires various information from the image data. Display 120 is for displaying various pieces of information related to component mounting system 1, such as an operating state of component mounting system 1, error occurrences, memory contents of memory device 115 (refer to FIG. 5), and so on, based on control signals from controller 102.

Memory device 115 is configured from an HDD or the like and saves various information required for performing mounting work such as image data obtained by component camera 90 and mark camera 91 under certain conditions, processing data representing the contents of image processing to be performed on the images captured by component camera 90, and the like. Accordingly, controller 102 is able to acquire information required for mounting work from memory device 115. Further, controller 102 acquires information required for image processing in image processing device 110 (for example, processing data and the like) from memory device 115 and sends the information to image processing device 110.

Here, processing data represents references or the like for determining the position of the component with respect to mounting head 26 and whether the component is good, and the contents of image processing with respect to the image data captured of the electronic component, and is linked to each component type such as connector, chip, or IC. Specifically, processing data includes, for each component type, component shape data, algorithm pattern data, tolerance value data, template data for rough positioning (seek lines), and the like.

Component shape data represents the outline shape of the component and is used as a reference when determining the position of the component with respect to mounting head 26 and whether the component is good. In the present embodiment, component shape data is created based on image data saved in memory device 115 by running a component shape data creation program (refer to FIG. 6) in data creation device 130. Algorithm pattern data defines the combination and order of image processing algorithms performed as pre-processing to determine the position of the component with respect to mounting head 26 and whether the component is good. Because the optimal combination and order of image processing algorithms depends on factors such as the color adjustment and contrast of a component in the image data, multiple algorithm patterns are defined for one component type.

Data creation device 130 is configured from a personal computer and includes control section 131 configured to include a CPU, ROM, RAM, and the like, an operating section including a keyboard, mouse, and the like, and display device 133 configured from an LCD display or the like. Data creation device 130 is used to create component shape data that configures the processing data based on image data memorized on memory device 115.

Mounting Work by Mounting Machines

On mounting machine 16, due to the configuration outlined above, it is possible to perform the work of mounting electronic components using mounting head 26 to a circuit board held by conveyance device 22. Specifically, by controller 102 performing a component mounting processing program or the like, work of picking up an electronic component, performing determinations with respect to the picked up component, and mounting work of mounting the electronic component on a circuit board is performed in component mounting system 1.

Based on commands of controller 102, a circuit board is conveyed to a work position, and fixedly held at that position by board holding device 48. Also, tape feeder 81, based on commands of controller 102, feeds taped components to supply an electronic component to a supply position. Then, mounting head 26, based on commands of controller 102, moves above the supply position of the electronic component and picks up and holds the electronic component using suction nozzle 62.

Continuing, based on commands of controller 102, mounting head 26 moves to a specified position above component camera 90. Based on commands of controller 102, component camera 90 images the electronic component picked up and held by mounting head 26. Based on commands of controller 102, the captured image data is saved on memory device 115. Here, controller 102 performs an image saving processing program (refer to FIG. 3), which is described later, and saves the image data in a compression format according to conditions during imaging. Then, image processing device 110, in accordance with commands of controller 102, performs image processing with respect to the image data based on the processing data. Controller 102, based on the image data on which image processing was performed by image processing device 110, determines the orientation and position of the electronic component held by mounting head 26, and whether the electronic component is good.

Then, mounting head 26, based on commands of controller 102, moves from above component camera 90 to above the circuit board held by board holding device 48, and mounts the electronic components for which the determination result was good at a specified position on the circuit board. Note that, based on commands of controller 102, mounting head 26 discards electronic components that were determined to be defective.

Processing Contents of Image Saving Processing Program

The processing contents of image saving processing by controller 102 are described next with reference to the flowchart shown in FIG. 3. The image saving processing program shown in FIG. 3 is performed by controller 102 when an electronic component picked up and held by mounting head 26 is imaged at the specified position above the component camera.

Figure 3:
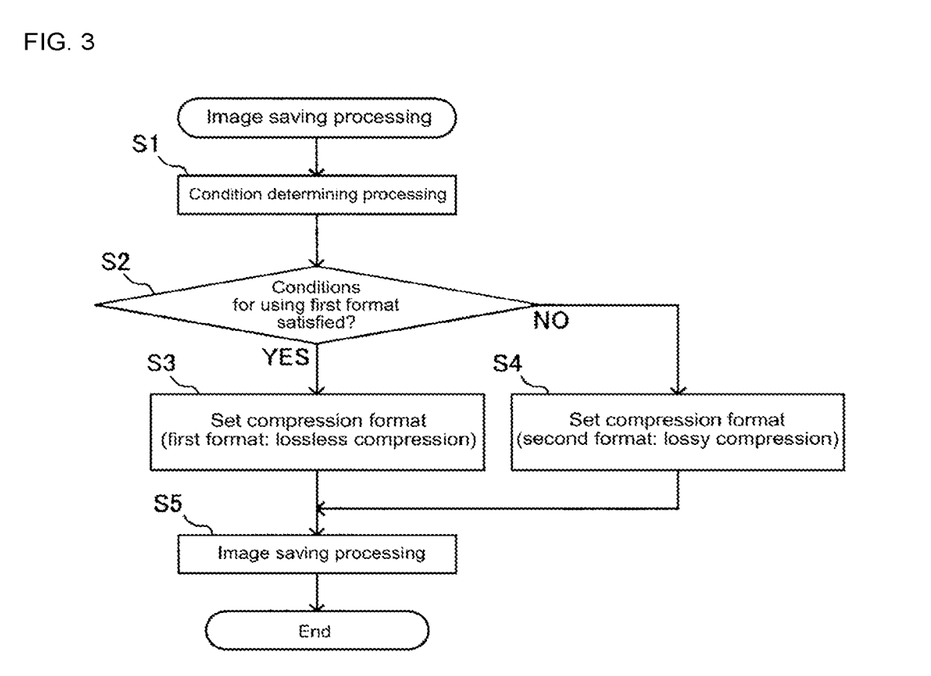
FIG. 3 is a flowchart of an image saving processing program according to an embodiment of the disclosure.

As shown in FIG. 3, in step (hereinafter simply referred to as "S") 1, controller 102 performs condition determining processing. In condition determining processing (S1), controller 102 determines whether the state of the captured image data of the electronic component captured by component camera 90 satisfies the conditions for using a specified first format. Conditions for using the first format in the present embodiment means conditions for determining high importance with respect to saving of the image data, and include conditions representing the fact that an error occurred during a process in electronic component mounting device 10, and conditions for which there is a high likelihood that the work environment in electronic component mounting device 10 will change.

Figure 4:
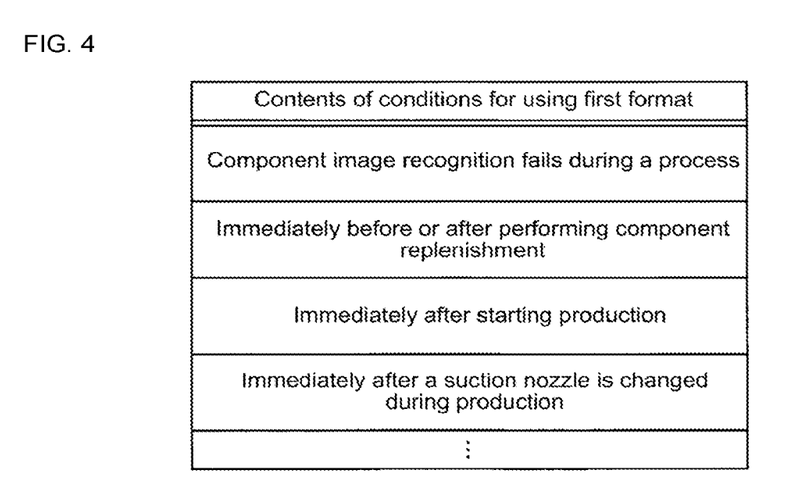
FIG. 4 illustrates detailed examples of conditions for using a first format according to an embodiment of the disclosure.

Conditions representing the fact that an error occurred during a process in electronic component mounting device 10 include a case in which image processing is performed on the image data and the position of the component and whether the component is good are determined, and the determination result is an error (refer to FIG. 4). Because the determination of the position of the component and whether the component is good based on the image data is performed by controller 102, controller 102, during condition determining processing (S1), can determine whether recognition of the component image failed in a process of electronic component mounting device 10.

Also, conditions for which there is a high likelihood that the work environment of electronic component mounting device 10 will change include directly before and directly after component replenishment (refer to FIG. 4). In the present embodiment, the total quantity of electronic components that configures a lot (that is, the total quantity of electronic components held as taped components) is known, and the quantity of electronic components used in mounting work at electronic component mounting device 10 is known for each set of mounting work. Accordingly, controller 102, during condition determining processing (S1), based on the above information, is able to determine whether it is directly before or directly after component replenishment.

Further, conditions for which there is a high likelihood that the work environment of electronic component mounting device 10 will change include directly after starting production of a circuit board, and directly after a suction nozzle 62 is changed during production of a circuit board (refer to FIG. 4). In electronic component mounting device 10, when production of a circuit is started, or when a suction nozzle 62 is changed during production, a control signal is sent to controller 102 based on a user operation. Accordingly, controller 102, during condition determining processing (S1), based on the received control signals, determines whether it is directly after production of a circuit board has started, or whether it is directly after a suction nozzle has been changed during production of a circuit board. After determinations have been made with regard to each of the multiple conditions that configured the conditions for using the first format, controller 102 ends condition determining processing (S1) and proceeds to S2.

In S2, controller 102, based on the determination results determined in the above condition determining processing (S1), decides whether any condition is satisfied among the multiple conditions for using the first format. If one of the conditions for using the first format is satisfied (S2: yes), controller 102 proceeds to S3. On the other hand, if none of the conditions for using the first format are satisfied (S2: no), controller 102 proceeds to S4.

Upon proceeding to S3, controller 102 sets the first format as the compression format for image data of electronic components imaged by component camera 90. The first format compresses image data in a lossless manner, for example, formats such as PNG, or GIF files. Upon proceeding to S3, a condition for using the first format is satisfied, thus the importance of the image data is high, so the chance that a larger amount of information will be required is high. Therefore, the compression format for the image data is set to the first format, for which the state during imaging can be recreated with high accuracy. Then, controller 101 proceeds to S5.

In S4, controller 102 sets the second format as the compression format for image data of an electronic component captured by component camera 90. The second format is a lossy compression file format with a higher compression rate than the first format. An example of the second format is JPEG. Upon proceeding to S4, conditions for using the first format are not satisfied, thus the importance of the image data is not so high, so a quantity of information that allows the image to be checked by the naked eye is sufficient. Accordingly, in S4, by setting the second format as the image data compression format, it is possible to reduce the load on memory device 115 in terms of memory capacity and data transmission, while saving the image data in an appropriate form for the required use. After setting the second format as the compression format for the image data, controller 102 proceeds to S5.

In S5, controller 102 performs image saving processing for saving the image data on memory device 115 in the compression format set in S3 or S4. Here, controller 102 memorizes identification information representing the compression format set in S3 or S4 on memory device 115 linked to the image data. After saving the image data compressed in either the first format or the second format and the identification information on memory device 115, controller 102 ends the image saving processing program.

The processing of image saving processing (S5) is described next in detail. When the first format is set as the compression format, controller 102 saves the image data captured by component camera 90 on memory device 115 in the first format, which is a lossless compression format. Here, controller 102 saves identification information representing the first format linked to the image data.

On the other hand, when the second format is set as the compression format, processing proceeds to image saving processing (S5) and controller 102 saves the image data captured by component camera 90 on memory device 115 in the second format, which is a lossy compression format. Here, controller 102 saves identification information representing the second format linked to the image data.

Example of Memory Contents of Memory Device 115

In component mounting system 1 of the present embodiment, by operating electronic component mounting device 10 and the like, it is possible to send control signals to controller 102 so as to display the memory contents of memory device 115 on display 120 or display section 133 of data creation device 130.

Figure 5:
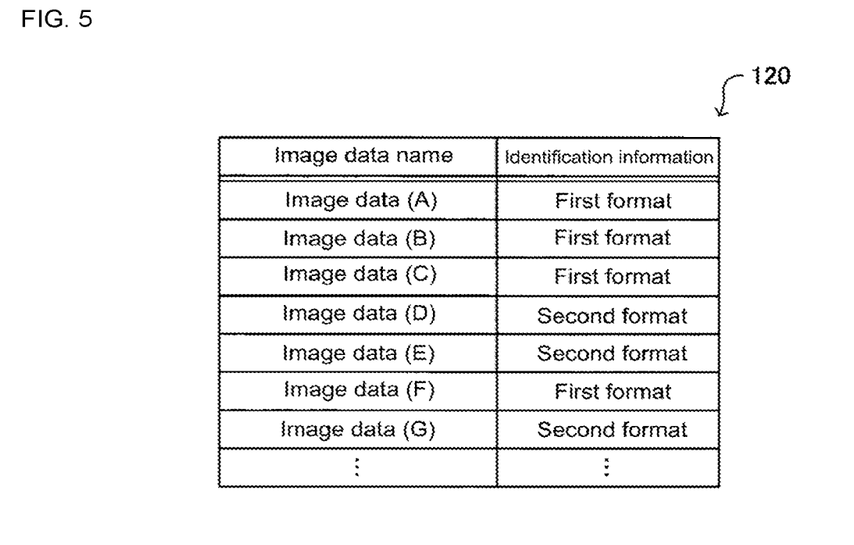
FIG. 5 shows an example of a table of memory contents of a memory device according to an embodiment of the disclosure.

When displaying the memory contents of memory device 115 on display 120 or the like, controller 102 references the memory contents of memory device 115 and displays the compressed image data and the identification information on display 120 or the like. As shown in FIG. 5, in this case, based on the memory contents of memory device 115, filenames of each image data, and the contents of the identification data linked to the image data (that is, an indication of the first format or the second format) are displayed on display 120 or the like. In this manner, when using image data saved on memory device 115, the user is able to determine whether each image data is saved in the first format (lossless compression) or the second format (lossy compression), to make effective use of appropriate image data.

Processing Contents of Component Shape Data Creation Program

In component mounting system 1 of the present embodiment, using data creation device 130, it is possible to create component shape data that configures processing data using the image data saved on memory device 115. In this case, control section 131 of data creation device 130, by performing the component shape data creation processing program (refer to FIG. 6), which is described later, creates component shape data from the image data saved on memory device 115.

Figure 6:
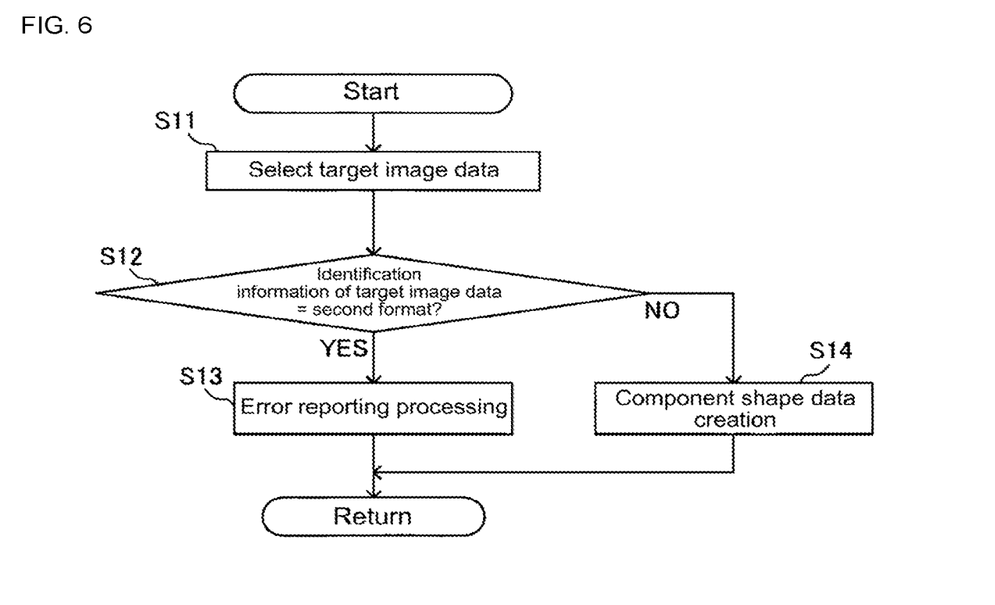
FIG. 6 is a flowchart of a component shape data creation program according to an embodiment of the disclosure.

As shown in FIG. 6, when the component shape data creation program is started, first, control section 131 selects the image data to be used as a base for creating the component shape data (hereinafter referred to as target image data) from the image data saved on memory device 115 (S11). Control section 131 identifies the target image data based on an operation signal from operation section 132. Then, control section 131 performs S12.

In S12, control section 131 references the memory contents of memory device 115 to determine whether the identification information linked to the target image data indicates the second format. Here, when creating component shape data, if not creating based on an actual data of an electronic component, the determination accuracy related to the position of the component and whether the component is good decreases. Accordingly, because image data compressed using the second format that is a lossy compression format does not have sufficient quantity of information, it is not appropriate as target image data for creating component shape data. On the other hand, if the image data is compressed using the first format that is a lossless compression format, because there is sufficient quantity of information, it is possible to create suitable component shape data.

In a case in which the identification information linked to the target image data is the second format (S12: yes), control section 131 proceeds to S13. On the other hand, in a case in which the identification information linked to the target image data is the first format (S12: no), control section 131 proceeds to S14.

Upon proceeding to S13, control section 131 performs error notification processing and reports to the user that the image data selected as target image data is not appropriate. For example, control section 131 displays on display section 133 that the image data selected as target image data is not appropriate. Thus, the user understands that the target image data has been selected incorrectly, and can take appropriate countermeasures (for example, reselecting the target image data or the like). After performing error notification processing, control section 131 ends the component shape data creation program.

In S14, control section 131 creates component shape data based on the image data selected as the target image data. In this case, because the target image data is in the first format that is a lossless compression format, control section 131 first decompresses the image data. By this, the target image data is converted from a state compressed in the first format to a state with the same information quantity from when the image was captured by component camera 90. Next, control section 131 performs image processing and the like for creating the component shape data with respect to the decompressed image data so as to create the component shape data. After saving the created component shape data on memory device 115 as processing data, control section 131 ends the component shape data creation program.

As described above, component mounting system 1 of the present embodiment includes electronic component mounting device 10, image processing device 110, memory device 115, display 120, and data creation device 130. In electronic component mounting device 10, each mounting machine 16 includes conveyance device 22, moving device 24, mounting head 26, supply device 28, and component camera 90. Mounting machine 16 uses mounting head 26 to pick up and hold an electronic component supplied by supply device 28, and captures an image of the held electronic component using component camera 90. Next, mounting machine 16, by holding and moving the electronic component using mounting head 26, mounts the electronic component onto a circuit board conveyed to a specified position by conveyance device 22.

Further, electronic component mounting device 10, when saving image data of the electronic component captured by component camera 90 on memory device 115, uses controller 102 to perform the image saving processing program (refer to FIG. 3). Here, controller 102, during condition determining processing (S1), determines whether the state when capturing the image data satisfies the conditions for using a specified first format used when the importance of the image is high. When conditions for using the first format are satisfied (S2: yes), controller 102 saves the image data captured by component camera 90 on memory device 115 in the first format, which is a lossless compression format. In cases in which the conditions for using the first format are satisfied, because in many cases a large amount of information is required when using the image data, by saving in a first format that is a lossless compression format, it is possible to maintain a sufficient amount of information, such that the image data can be used effectively.

Further, in electronic component mounting device 10, when conditions for using the first format are not satisfied (S2: no), controller 102 saves the image data captured by component camera 90 on memory device 115 in the second format, which is a lossy compression format. In cases in which the conditions for using the first format are not satisfied, because there are many cases in which a large amount of information is not required when using the data, by saving in a second format that is a lossy compression format, this is efficient from both the point of view of the information amount and from the point of view of the memory capacity of memory section 115. In other words, because the image data captured by component camera 90 is saved on memory device 115 in either a first format that is a lossless compression format or a second format that is a lossy compression format in accordance with whether a state of a captured image satisfies conditions for using the first format, it is possible to save the captured image data on memory device 115 in an appropriate form while reducing the load with respect to the memory capacity of memory device 115.

As shown in FIG. 4, conditions for using the first format determined by the condition determining processing (S1) include conditions representing the fact that an error occurred during a process in electronic component mounting device 10, and conditions for which there is a high likelihood that the work environment in electronic component mounting device 10 will change. Conditions representing the fact that an error occurred during a process in electronic component mounting device 10 include a case in which, in electronic component mounting device 10, image processing is performed on the image data and the position of the component and whether the component is good are determined, and the determination result is an error.

In this case, because an error has occurred as the determination result, it is necessary to check again to ensure that the same error does not occur again, and to ensure that the processing contents of the image processing are in an appropriate state. Because in this case too, according to electronic component mounting device 10, the image data is saved in the first format that is a lossless compression format, it is possible to perform checking reliably with high accuracy, such that it is possible to ensure that the processing contents and the like of image processing are appropriate.

Further, conditions for which there is a high likelihood that the work environment of electronic component mounting device 10 will change include directly before and directly after replenishment of electronic components is performed, directly after starting production of a circuit board, and directly after a suction nozzle 62 is changed during production of a circuit board (refer to FIG. 4). Here, when the work environment changes, the chance of an error occurring during a process at electronic component mounting device 10 is high. By saving image data from this state in the first format that is a lossless format, it is possible to continuously adjust such that processing contents and the like of image processing is in an appropriate state.

Further, in component mounting system 1 including electronic component mounting device 10, controller 102 performs image saving processing (S5) so as to save the image data on memory device 115 using a compression format set in S3 or S4. Here, controller 102 memorizes identification information representing the compression format set in S3 or S4 on memory device 115 linked to the image data. By this, according to electronic component mounting system 1, when using image data saved on memory device 115, because it is possible to identify between the first format that is a lossless compression format and the second format that is a lossy compression format based on the identification information linked to the image data, it is possible to make appropriate use of the image data saved on memory device 115.

As shown in FIG. 5, in component mounting system 1, in a case in which the memory contents saved on memory device 115 are displayed on display 120 or the like, it can be displayed whether the image data is based on the first format or based on the second format based on the identification information linked to the image data. According to component mounting system 1, because it is possible for a user to understand the difference between image data of the first format and the second format from the contents displayed on display 120 or the like, it is possible to more reliably make appropriate use of the image data saved on memory device 115.

Also, in component mounting system 1, using data creation device 130, it is possible to create component shape data using the image data saved on memory device 115. Here, control section 131 of data creation device 130, based on the identification information of image data saved on memory device 115, determines whether the target image data is appropriate for creation of component shape data (S12), and in a case where it is not target image data, performs error reporting processing (S13). By this, according to component mounting system 1, unnecessary processing and the like can be omitted, and the efficiency of creating component shape date can be improved, without performing creation processing of component shape data using inappropriate image data.

Note that, in an embodiment above, component mounting system 1 is an example of a component mounting system of the present disclosure, and electronic component mounting device 10 is an example of a component mounting device of the present disclosure. Also, supply device 28 is an example of a component supply section of the present disclosure, and mounting head 26 is example of a pickup nozzle of the present disclosure. Component camera 90 is an example of an imaging section of the present disclosure, and memory device 115 is an example of a memory section in the present disclosure. Control device 100 and controller 102 are examples of a condition determining section, a saving control section, and a display control section of the present disclosure, and display 120 is an example of a display section of the present disclosure. Data creation device 130 and control section 131 are examples of a processing section, a suitability determining section, and a reporting control section of the present disclosure.

The present disclosure is not limited to the above-described embodiments and may be improved and modified in various ways without departing from the scope of the disclosure. For example, in an embodiment above, component mounting system 1 is configured form electronic component mounting device 10, control device 100, image processing device 110, memory device 115, display 120, and data creation device 130, but the configuration is not limited to this.

For example, by integrating control device 100, image processing device 110, memory device 115, display 120, and data creation device 130 inside a single electronic component mounting device 10, it is possible to realize component mounting system 1 as electronic component mounting device 10. Also, component mounting system 1 may be realized by integrating a portion of image processing device 110, memory device 115, display 120, and data creation device 130 inside electronic component mounting device 10, and connecting the remaining items to electronic component mounting device 10 via a network.

In an embodiment above, component mounting system 1 is configured form one each of electronic component mounting device 10, image processing device 110, memory device 115, and data creation device 130, but the configuration is not limited to this. Component mounting system 1 may be configured such that multiple electronic component mounting devices 10 are connected to a single image processing device 110, memory device 115, display 120, and data creation device 130.

Conditions for using the first format of an embodiment above are simply an example, and the conditions are not limited to the example shown in FIG. 4 so long as the conditions represent a state of high importance with regard to saving image data. Also, the conditions representing the fact that an error occurred during a process in electronic component mounting device 10, and the conditions for which there is a high likelihood that a work environment will change at component mounting device 10 are not limited to the examples shown in FIG. 4, and conditions representing various states may be used.

Further, in an embodiment above, during image saving processing (S5), controller 102 saves identification information representing the first format on memory device 115 linked to image data losslessly compressed using the first format (S3, S5), and saves identification information representing the second format on memory device 115 linked to image data lossily compressed using the second format, but the configuration is not limited to this. For example, the configuration may be such that identification information is saved linked to only one of the image data losslessly compressed using the first format or the image data lossily compressed using the second format.

Further, in an embodiment above, when the memory contents of memory device 115 are displayed on display 120 or the like, a character string of "first format" or "second format" linked to the filenames of the image data is displayed based on the identification information of each image data (refer to FIG. 5). However, the display method when displaying the memory contents of memory device 115 on display 120 or the like is not limited to this. For example, the first format and the second format may be distinguished by changing the file extension of the image data based on the identification information of each data and displaying that. Alternatively, the first format and the second format may be distinguished by adding a prefix to the filename of the image data based on the identification information of each data and displaying that.

Also, in an embodiment above, data creation device 130 of component mounting system 1 is used for creation processing of component shape data, but the processing contents of the processing section of the present disclosure is not limited to this. The processing section of the present disclosure may perform any type of processing that uses image data saved on memory device 115, such as performing error reporting processing (S13) in a case in which a user tries to use a non-target format when the only target format is one of the first format or the second format.

REFERENCE SIGNS LIST

1: component mounting system;
10: electronic component mounting device;
16: mounter;
22: conveyance device;
24: moving device;
26: mounting head;
28: supply device;
62: suction nozzle;
81: tape feeder;
90: component camera;
100: control device;
102: controller;
110: image processing device;
115: memory device;
120: display;
130: data creation device

The invention claimed is:

1. A component mounting device comprising:
a component supply section configured to supply components to be mounted at a specified position of a board;
a pickup nozzle configured to pick up a component supplied by the component supply section;
an imaging section configured to acquire image data by imaging a component picked up by the pickup nozzle;
a memory section configured to save the image data imaged by the imaging section;
a condition determining section configured to determine whether a state of an image imaged by the imaging section satisfies specified conditions for high importance; and
a saving control section configured to, in a case in which it is determined by the condition determining section that the conditions for high importance are satisfied, save the image data imaged by the imaging section on the memory section in a first format that is a lossless compression format, and in a case in which it is determined by the condition determining section that the conditions for high importance are not satisfied, save the image data imaged by the imaging section on the memory section in a second format that is a lossy compression format.

2. The component mounting device according to claim 1, wherein
the conditions for determining high importance in the condition determining section include at least one of
a condition indicating that an error has occurred during a process of the component mounting device, or
a condition indicating that there is a high likelihood that a work environment will change at the component mounting device.

3. A component mounting system comprising:
a component mounting device including
a component supply section configured to supply components to be mounted at a specified position of a board,
a pickup nozzle configured to pick up a component supplied by the component supply section,
an imaging section configured to acquire image data by imaging a component picked up by the pickup nozzle, and
a memory section configured to save the image data imaged by the imaging section;
a condition determining section configured to determine whether a state of an image imaged by the imaging section satisfies specified conditions for high importance; and
a saving control section configured to, in a case in which it is determined by the condition determining section that the conditions for high importance are satisfied, save the image data imaged by the imaging section on the memory section in a first format that is a lossless compression format, and in a case in which it is determined by the condition determining section that the conditions for high importance are not satisfied, save the image data imaged by the imaging section on the memory section in a second format that is a lossy compression format, the saving control section being further configured to, when saving the image data on the memory section, save identification information linked to the image data, the identification information being able to be used to identify whether the image data is based on the first format or whether the image is based on the second format.

4. The component mounting system of claim 3, further comprising:
a display section configured to display various information, and
a display control section configured to control display contents on the display section, the display control section being configured to, when displaying the image data saved on the memory section, create a display such that it is possible to identify whether the image data is based on the first format or is based on the second format based on the identification information linked to each of the image data.

5. The component mounting system according to claim 3, further comprising
- a processing section configured to perform specified processing using the image data saved on the memory section, the processing section including
- a suitability determining section configured to determine whether the image data is suitable as a processing target on which the specified processing is to be performed based on the identification information linked to the image data that is the processing target for the specified processing, and
- a reporting control section configured to, in a case in which it is determined by the suitability determining section that the image data is not suitable as the processing target for the specified processing, report the fact that the image data is unsuitable as the processing target.

* * * * *